US012628289B2

(12) United States Patent
Huang et al.

(10) Patent No.: US 12,628,289 B2
(45) Date of Patent: May 12, 2026

(54) SUPPORT MEMBER OF FLEXIBLE DISPLAY MODULE AND MANUFACTURING METHOD THEREOF, FLEXIBLE DISPLAY MODULE, ELECTRONIC DEVICE AND ASSEMBLY TABLE

(71) Applicants: Chengdu BOE Optoelectronics Technology Co., Ltd., Chengdu (CN); BOE Technology Group Co., Ltd., Beijing (CN)

(72) Inventors: Xiaoxia Huang, Beijing (CN); Hufei Yang, Beijing (CN); Liang Gao, Beijing (CN); Ajuan Du, Beijing (CN); Feifan Li, Beijing (CN); Hao Sun, Beijing (CN); Yongle Wang, Beijing (CN); Enjian Yang, Beijing (CN); Yilun Zeng, Beijing (CN); Guodong Zeng, Beijing (CN); Yiqian Wu, Beijing (CN); Yunhui Huang, Beijing (CN); Wei Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 135 days.

(21) Appl. No.: 18/293,786

(22) PCT Filed: May 12, 2023

(86) PCT No.: PCT/CN2023/094000
§ 371 (c)(1),
(2) Date: Jan. 31, 2024

(87) PCT Pub. No.: WO2023/231747
PCT Pub. Date: Dec. 7, 2023

(65) Prior Publication Data
US 2025/0008671 A1     Jan. 2, 2025

(30) Foreign Application Priority Data
May 31, 2022    (CN) .......................... 202221357496.4

(51) Int. Cl.
*G09F 9/00* (2006.01)
*H05K 5/02* (2006.01)

(52) U.S. Cl.
CPC .................................. *H05K 5/0217* (2013.01)

(58) Field of Classification Search
None
See application file for complete search history.

(56) References Cited

U.S. PATENT DOCUMENTS 8,449,167 B2 *  5/2013  Wakaki ................ G02B 6/0081
                                            362/633
11,469,395 B2 *  10/2022  Luo ........................ G06F 1/1652
(Continued)

FOREIGN PATENT DOCUMENTS

CN          1979304 A     6/2007
CN        201218891 Y     4/2009
(Continued)

*Primary Examiner* — Xanthia C Relford
(74) *Attorney, Agent, or Firm* — XSENSUS LLP

(57) ABSTRACT

Provided is a support member of a flexible display module. The support member includes: a body portion and a plurality of outward protrusion portions. The plurality of outward protrusion portions are at least distributed at two opposite sides of the body portion and protrude outwards relative to the sides of the body portion. A positioning hole is formed in each of the outward protrusion portions.

20 Claims, 13 Drawing Sheets

(56)                 References Cited

U.S. PATENT DOCUMENTS

| | | | |
|---|---|---|---|
| 2005/0231658 A1* | 10/2005 | Chieh | ............... G02F 1/133308 |
| | | | 349/56 |
| 2007/0127270 A1 | 6/2007 | Chang | |
| 2012/0176558 A1 | 7/2012 | Nakamura | |
| 2019/0014674 A1 | 1/2019 | Lin et al. | |
| 2019/0196548 A1 | 6/2019 | Kim et al. | |
| 2021/0150942 A1* | 5/2021 | Han | ........................ G09F 9/301 |
| 2021/0337676 A1 | 10/2021 | Chu | |

FOREIGN PATENT DOCUMENTS

| | | |
|---|---|---|
| CN | 104345970 A | 2/2015 |
| CN | 108520703 A | 9/2018 |
| CN | 109215507 A | 1/2019 |
| CN | 109979323 A | 7/2019 |
| CN | 209928186 U | 1/2020 |
| CN | 210667568 U | 6/2020 |
| CN | 113949760 A | 1/2022 |
| CN | 218241215 U | 1/2023 |
| JP | 2020-082895 A | 6/2020 |
| TW | M277249 U | 10/2005 |
| WO | 2011/040427 A1 | 4/2011 |

* cited by examiner

30a

302

20b

302

30a

SUPPORT MEMBER OF FLEXIBLE DISPLAY MODULE AND MANUFACTURING METHOD THEREOF, FLEXIBLE DISPLAY MODULE, ELECTRONIC DEVICE AND ASSEMBLY TABLE

This application is a U.S. national stage of international application No. PCT/CN2023/094000, field on May 12, 2023, which claims priority to Chinese Utility Patent Application No. 202221357496.4, filed on May 31, 2022 and entitled "SUPPORT MEMBER OF FLEXIBLE DISPLAY MODULE AND MANUFACTURING METHOD THEREOF, FLEXIBLE DISPLAY MODULE. ELECTRONIC DEVICE AND ASSEMBLY TABLE," the contents of each are incorporated herein by reference in their entireties.

TECHNICAL FIELD

The present disclosure relates to the field of display devices, and in particular relates to a support member of a flexible display module and a manufacturing method thereof, a flexible display module, an electronic device, and an assembly table.

BACKGROUND

With the development of the technology, electronic devices are more and more widely used and become one of the important tools in daily work and life of people. Foldable electronic devices are gradually favored by users due to small size and good portability.

SUMMARY

According to some embodiments of the present disclosure, a support member of a flexible display module is provided. The support member includes a body portion and a plurality of outward protrusion portions, wherein the plurality of outward protrusion portions are at least distributed at two opposite sides of the body portion and protrude outwards relative to the sides of the body portion, and a positioning hole is formed in each of the outward protrusion portions.

In some embodiments, the positioning holes are circular holes, elliptical holes, or strip-shaped holes.

In some embodiments, the positioning holes in at least two of the plurality of outward protrusion portions have different shapes.

In some embodiments, the body portion has two first sides that are opposite to each other and two second sides that are opposite to each other, two ends of each of the two second sides being respectively connected to the two first sides; the body portion has a bending region, the bending region extending from one of the two first sides to the other of the two first sides; and the two second sides are each connected to at least one of the outward protrusion portions.

In some embodiments, at least one of the two first sides is connected to one of the outward protrusion portions.

In some embodiments, the plurality of outward protrusion portions at least include first outward protrusion portions and second outward protrusion portions, wherein the positioning holes in the first outward protrusion portions are t circular holes, the positioning holes in the second outward protrusion portions are elliptical holes each with a short axis length being greater than a diameter of each of the circular holes or strip-shaped holes each with a width being greater than the diameter of each of the circular hole, the first outward protrusion portions a connected to the first sides, and the second outward protrusion portions are connected to the second sides.

In some embodiments, length directions of the positioning holes in the second outward protrusion portion are perpendicular or parallel to the second sides, wherein in the case that the positioning holes in the second outward protrusion portions the elliptical holes, the length direction of each of the positioning holes is a long axis direction of each of the elliptical holes, and wherein in the case that the positioning holes in the second outward protrusion portions are strip-shaped holes, the length direction of each of the positioning holes is a length direction of each of the strip-shaped holes.

In some embodiments, each of the second sides is connected to two of the second outward protrusion portions, wherein on at least one of the second sides, the length directions of the positioning holes in the two of the second outward protrusion portions connected to the same second side are perpendicular to each other.

In some embodiments, a ratio of a length to a width of each of the positioning holes in the second outward protrusion portions is in the range of (1, 1.3].

In some embodiments, a length of a short axis of each of the elliptical holes is 1.1 times to 1.5 times a diameter of each of the circular holes; and a width of each of the strip-shaped holes is 1.1 times to 1.5 times a radius of each of the circular holes.

In some embodiments, a length of a long axis of each of the elliptical holes is not less than the diameter of each of the circular holes, and a length of a short axis of each of the elliptical holes is not greater than the diameter of each of the circular holes; wherein the length of each of the strip-shaped holes is not less than the diameter of each of the circular holes, and a width of each of the strip-shaped holes is not greater than the diameter of each of the circular holes.

In some embodiments, a first strip-shaped groove is arranged in the support member, wherein the first strip-shaped groove is arranged in a junction of the outward protrusion portions and the body portion and extends along an edge of the body portion.

In some embodiments, a plurality of through-holes are arranged in the support member, wherein the plurality of through-holes are arranged in a junction of the outward protrusion portions and the body portion and are spaced along an edge of the body portion.

In some embodiments, the body portion has a first surface and a second surface that are opposite to each other, wherein the first surface is configured to connect a flexible display panel, and a surface, close to the second surface, of each of the outward protrusion portions is coplanar with the second surface.

In some embodiments, the plurality of outward protrusion portions at least include first protrusion portions and second protrusion portions, the positioning holes in the first protrusion portions are the circular holes, and the positioning holes in the second protrusion portion are the elliptical holes or strip-shaped holes; one of the two first sides is connected to at least one of first outward protrusion portions and the other of the two first sides is connected to at least one of the second outward protrusion portions; each of the two second sides is connected to at least one of the first outward protrusion portions and at least one of second outward protrusion portions, and the first outward protrusion portions connected to the second sides are close to the first sides connected to the second outward protrusion portions, and the second outward protrusion portions connected to the second sides are close to the first sides connected to the first outward protrusion portions.

In some embodiments, length directions of the positioning holes in the second outward protrusion portions connected to the first sides are perpendicular to the first sides, and length directions of the positioning holes in the second outward protrusion portions connected to the second sides are perpendicular to the second sides.

In some embodiments, a diameter of each of the positioning holes in the first outward protrusion portions connected to the first sides is less than a diameter of each of the positioning holes in the first outward protrusion portions connected to the second sides.

According to some embodiments of the present disclosure, a method for manufacturing a support member for a flexible display module is provided. The method includes: providing a plate; and stamping the plate to form a body portion and a plurality of outward protrusion portions that are connected, wherein the outward protrusion portions are at least distributed at two opposite sides of the body portion and protrude outwards relative to the sides of the body portion, and the outward protrusion portions are provided with positioning holes.

According to some embodiments of the present disclosure, a flexible display module is provided. The flexible display module includes a flexible display panel and the support member as described in the first aspect, wherein the flexible display panel is disposed on one side of the support member and connected to a body portion of the support member, the protrusion portion of the support member protrude outwards relative to an edge of the flexible display panel.

According to some embodiments of the present disclosure, an electronic device is provided. The electronic device includes a foldable center frame and the flexible display module as described in the second aspect, wherein the flexible display module is connected to the foldable center frame.

According to some embodiments of the present disclosure, an assembly table is provided. The assembly table includes a support portion and a plurality of positioning columns, wherein the support portion has a support surface for carrying the flexible display module as described in the second aspect, the plurality of positioning columns stand on the support surface and are connected to the support surface, and the plurality of positioning columns are configured to be engaged with positioning holes in at least portion of the outward protrusion portions of the support member.

In some embodiments, each of the positioning columns includes a first section and a second section, wherein the first section is a straight column, the second section is a table body, one end of the first section is connected to the support surface, and the other end of the first section is connected to a larger end of the second section.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description illustrate merely some embodiments of the present disclosure, and persons of ordinary skill in the art may still derive other drawings from these accompanying drawings without creative efforts.

4

Figure 1:
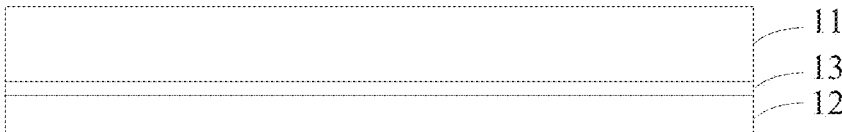
Figure 2:
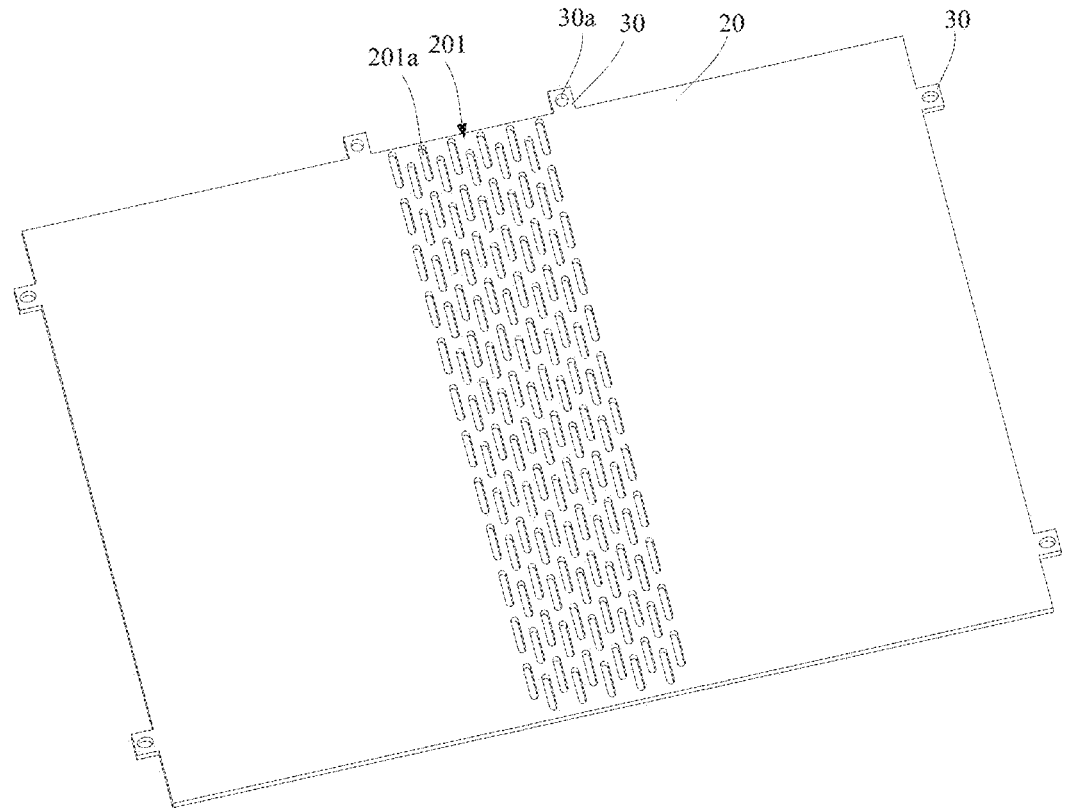
Figure 3:
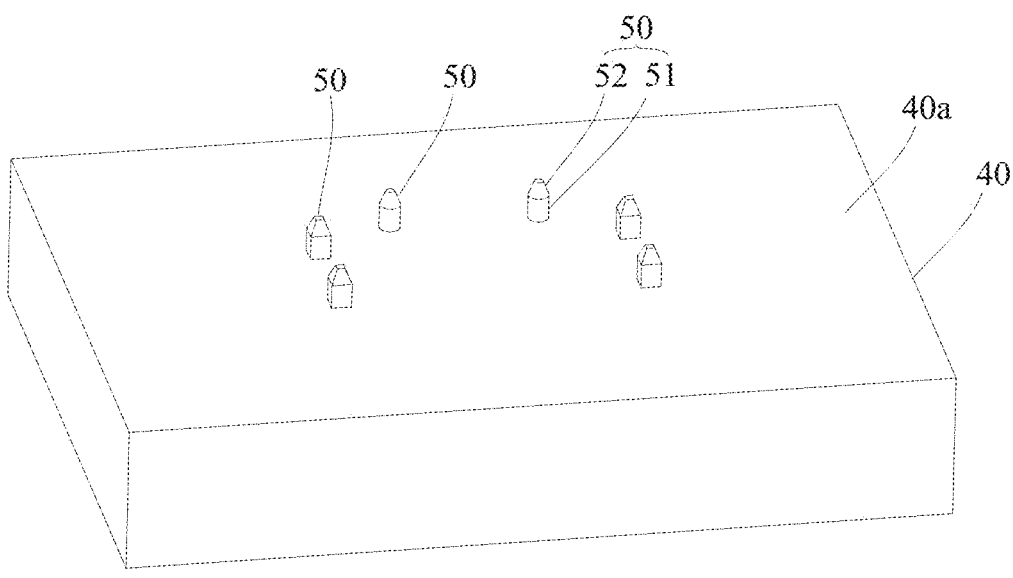
Figure 4:
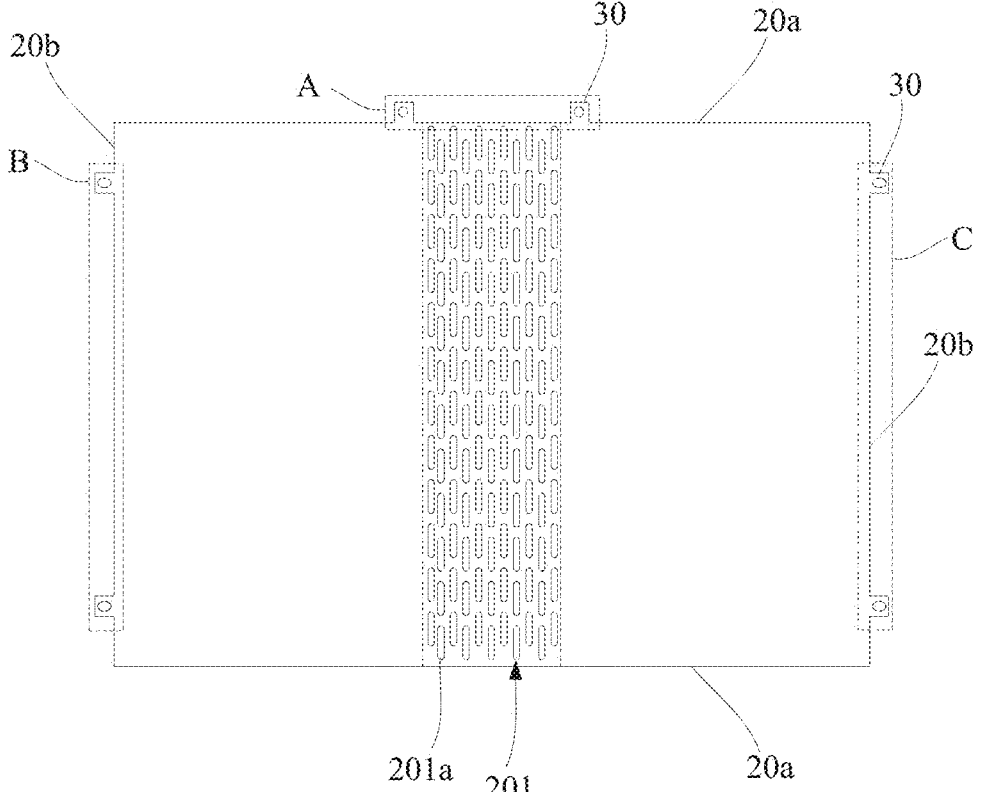
Figure 5:
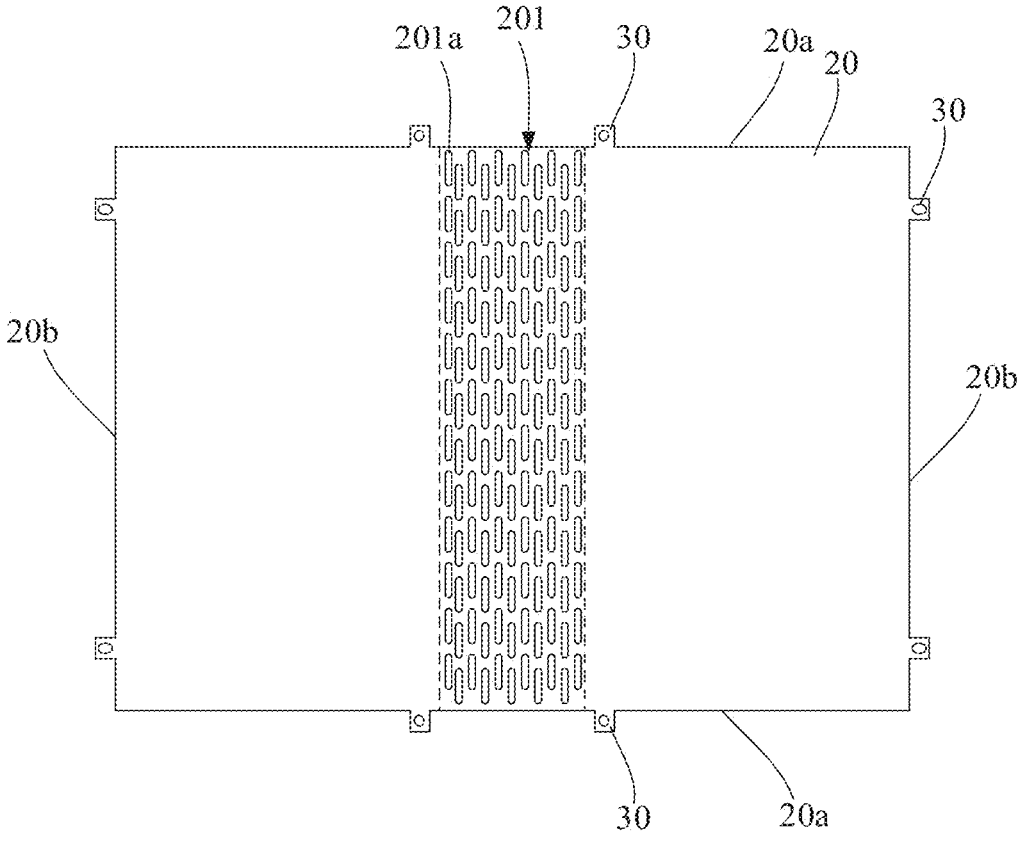
Figure 6:
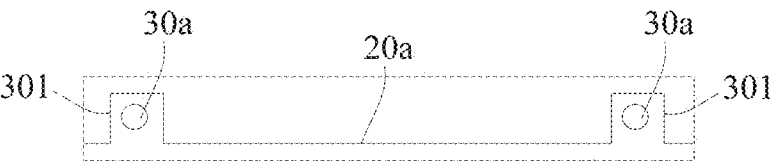
Figure 7:
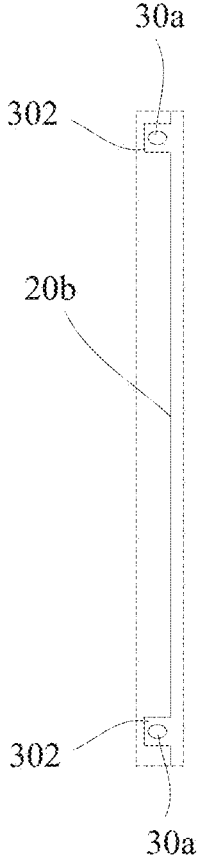
Figure 8:
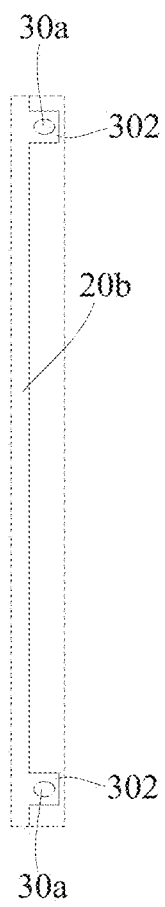
Figure 9:
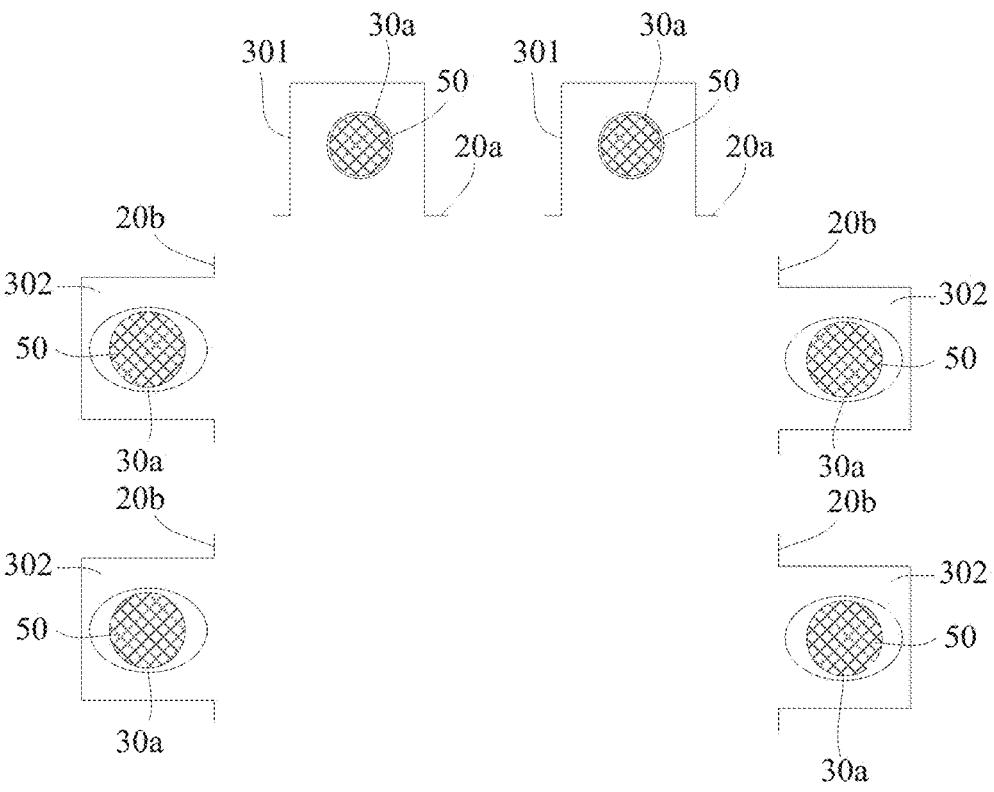
Figure 10:
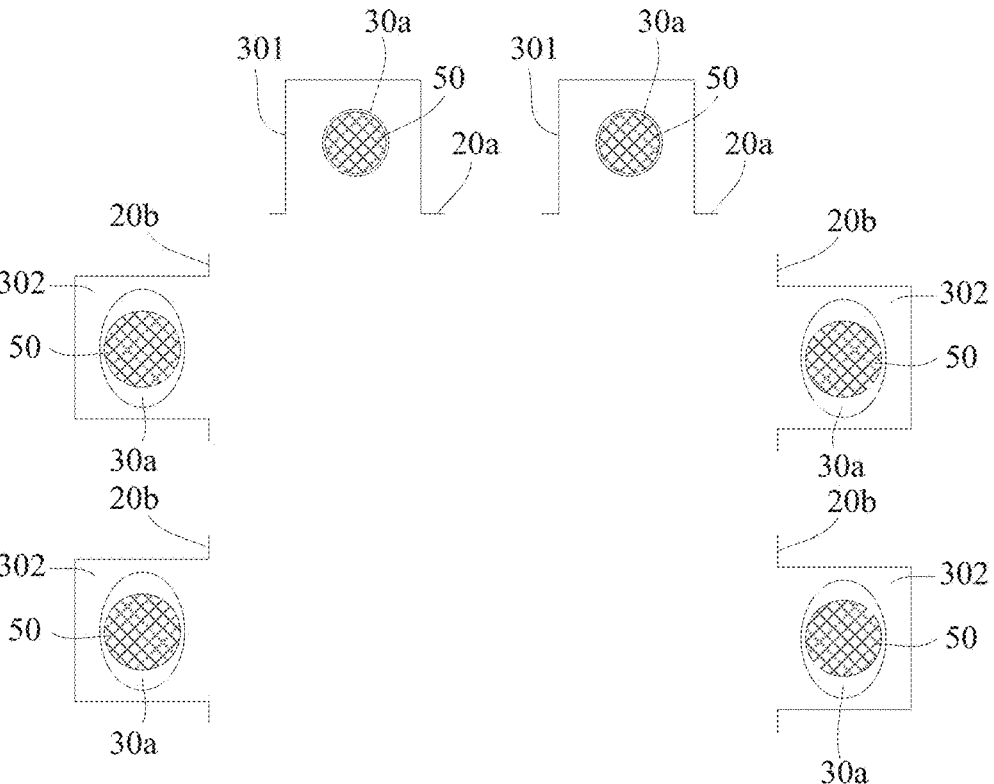
Figure 11:
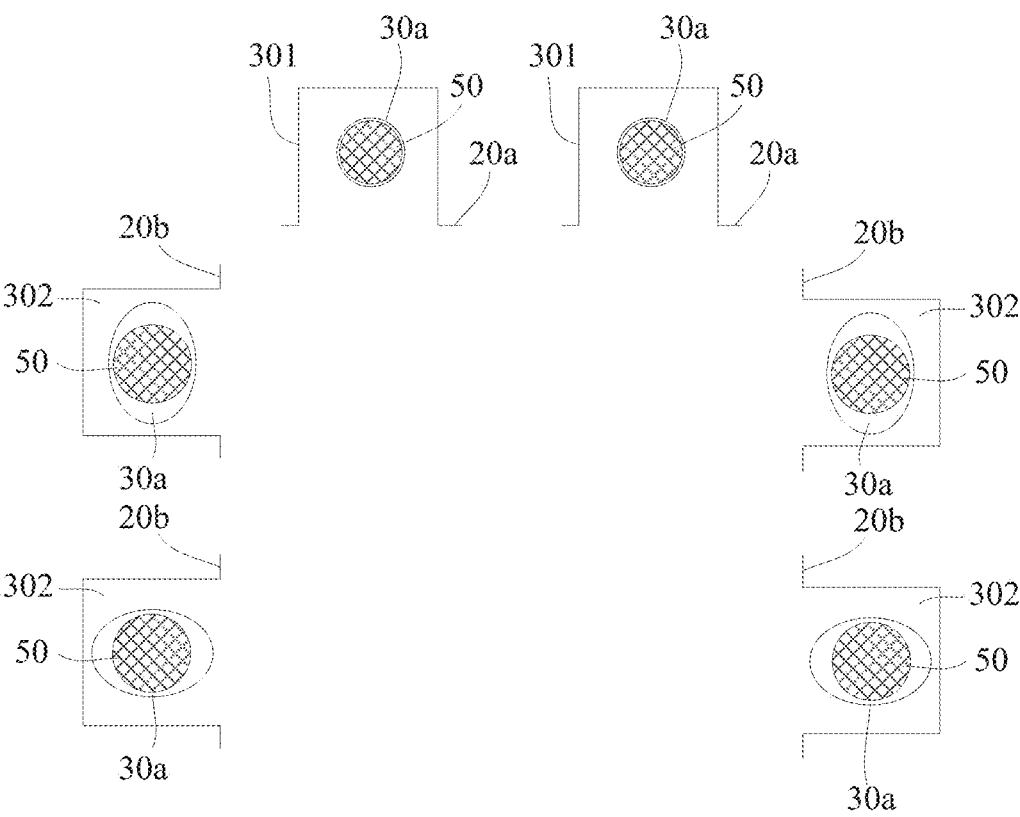
Figure 12:
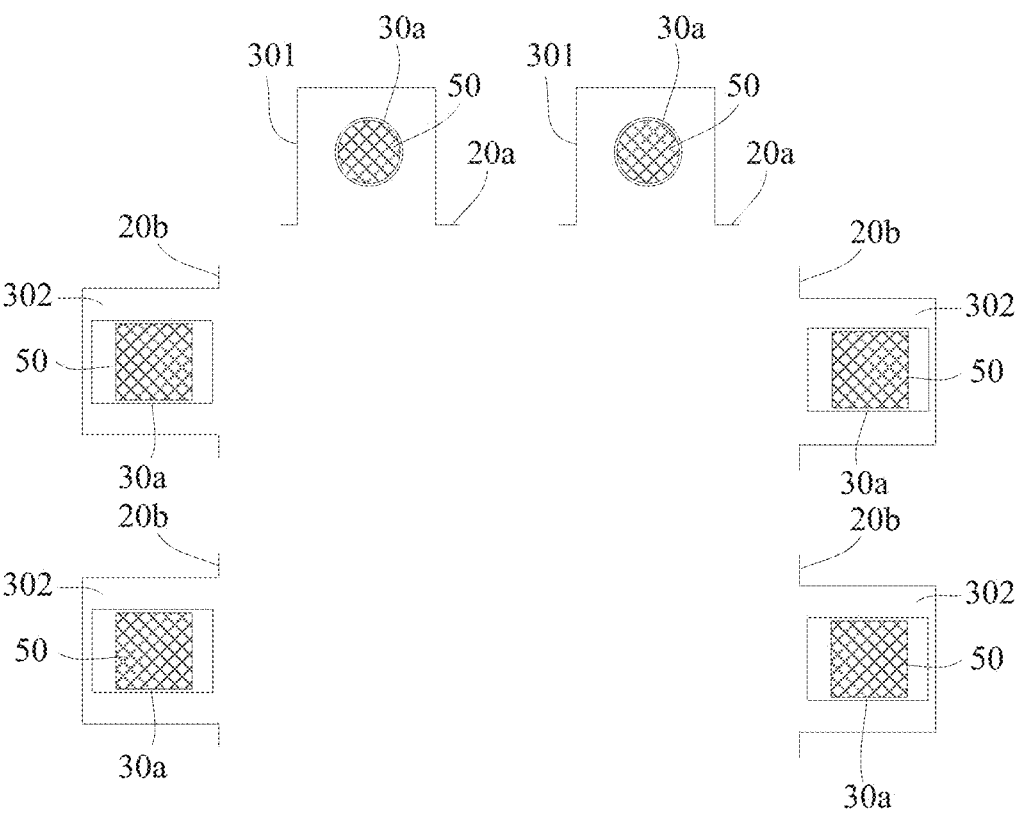
Figure 13:
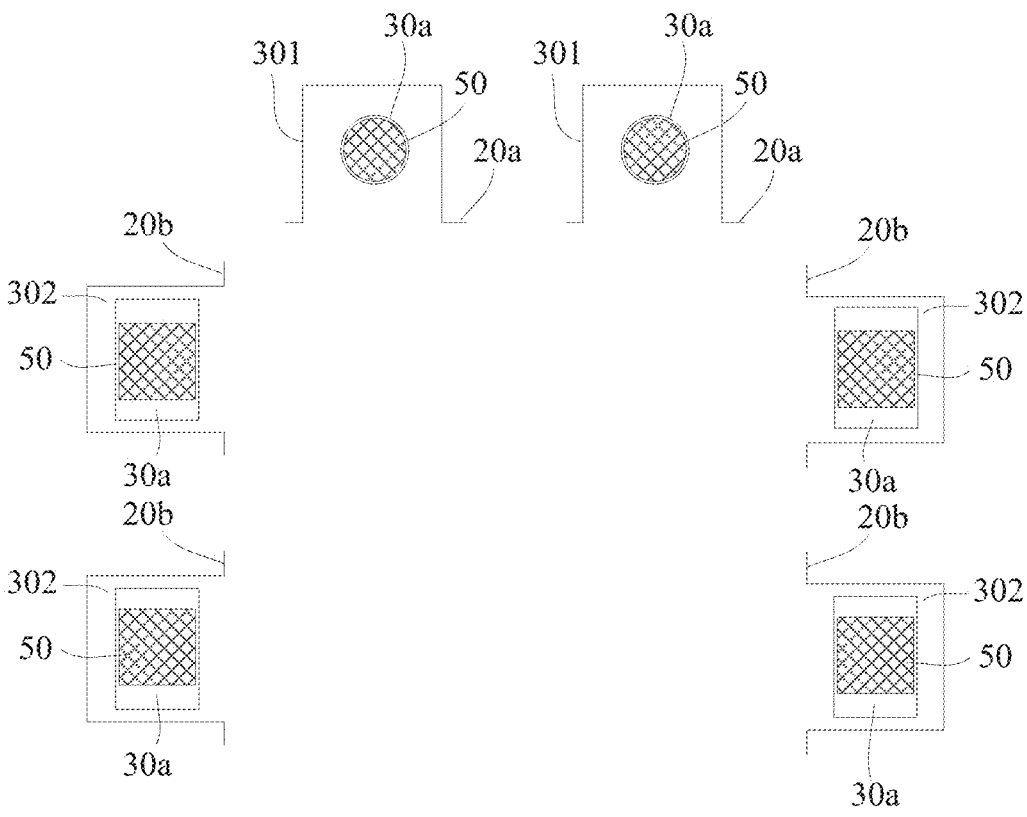
Figure 14:
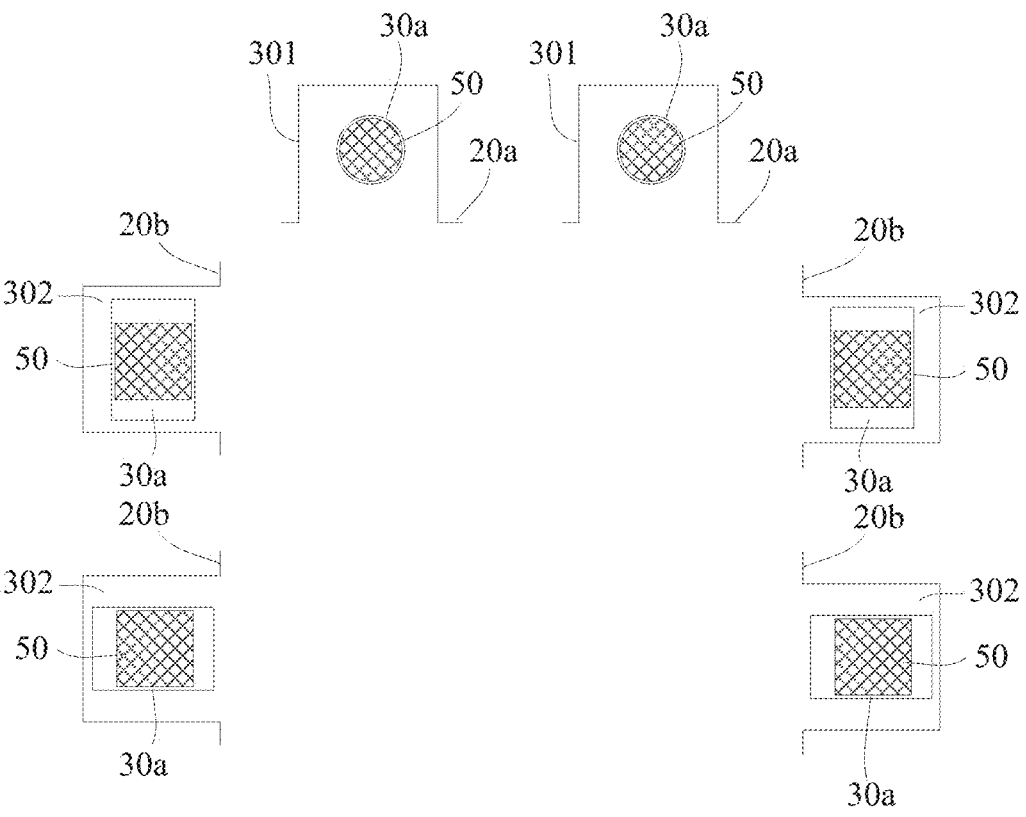
Figure 15:
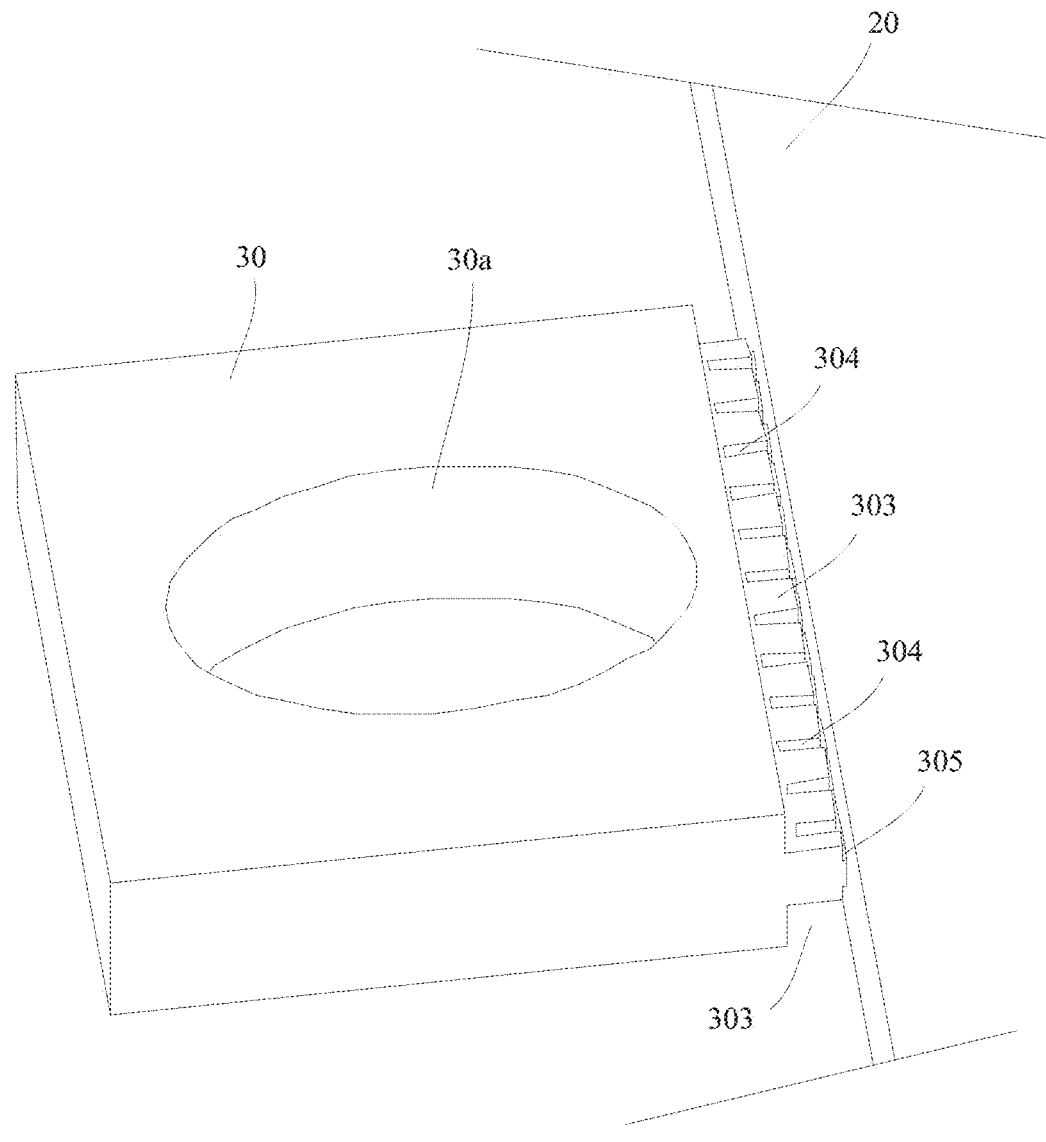
Figure 16:
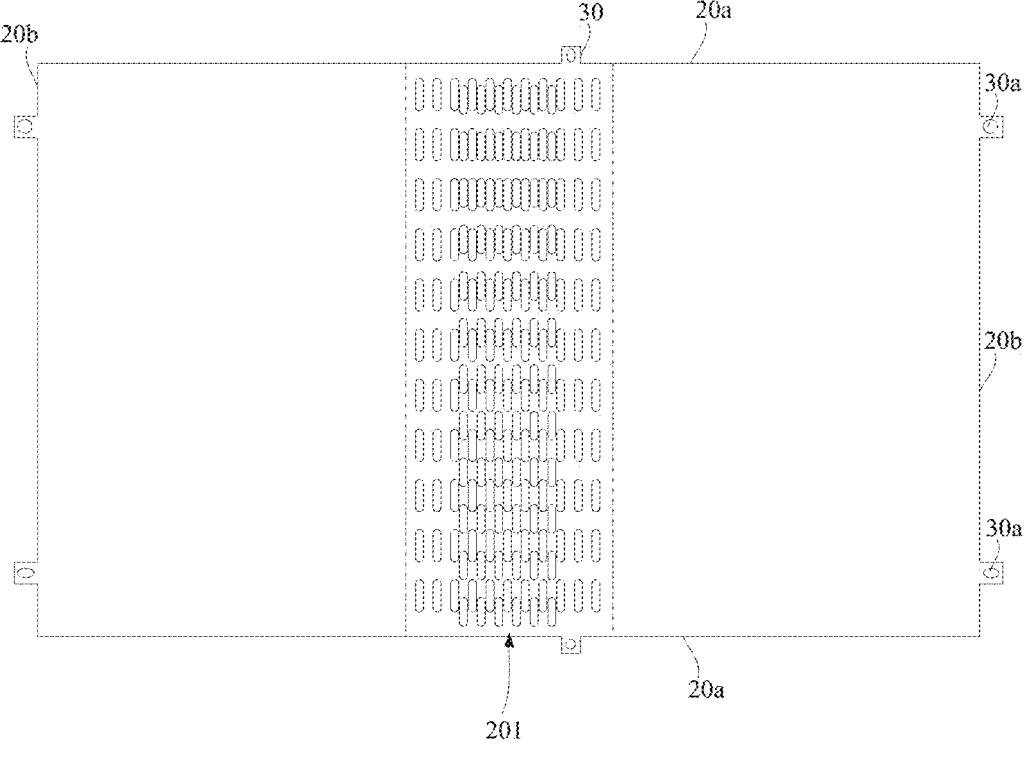
Figure 17:
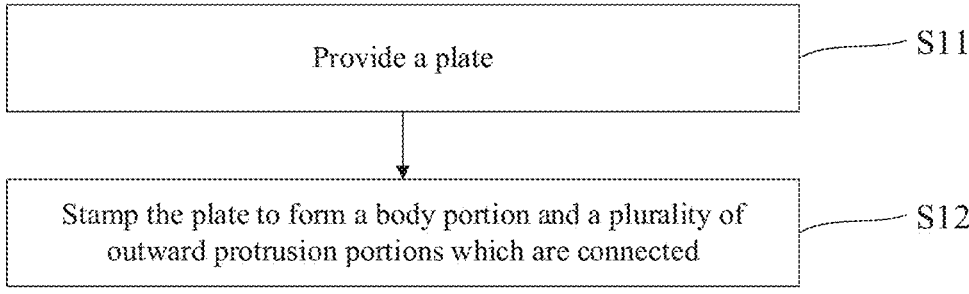
Figure 18:
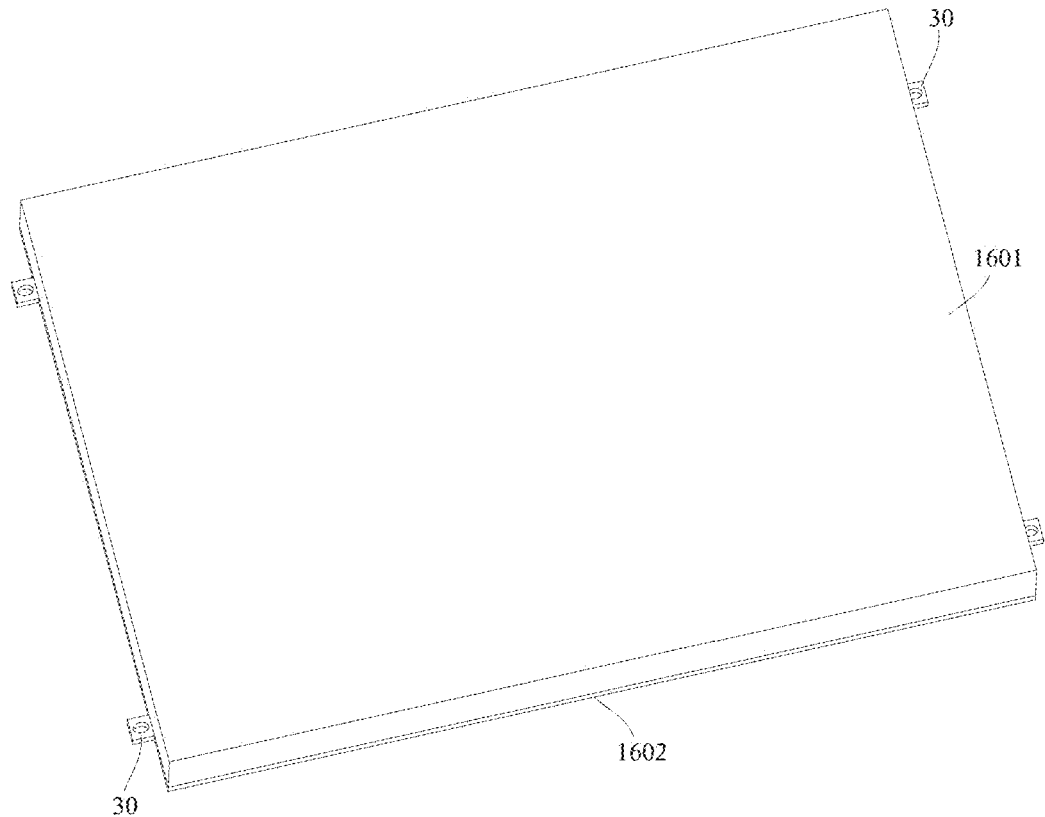

FIG. 1 is a schematic structural view of a flexible display module in some practices;

FIG. 2 is a schematic structural view of a support member of a flexible display module according to some embodiments of the present disclosure:

FIG. 3 is a schematic structural view of an assembly table according to some embodiments of the present disclosure;

FIG. 4 is a top view of a support member according to some embodiments of the present disclosure:

FIG. 5 is a schematic structural view of a support member according to some embodiments of the present disclosure;

FIG. 6 is a schematic enlarged view at a region A in FIG. 4:

FIG. 7 is a schematic enlarged view at a region B in FIG. 4:

FIG. 8 is a schematic enlarged view at a region C in FIG. 4;

FIG. 9 is a schematic view of engagement between an outward protrusion portion and a positioning column according to some embodiments of the present disclosure:

FIG. 10 is a schematic view of engagement between an outward protrusion portion and a positioning column according to some embodiments of the present disclosure:

FIG. 11 is a schematic view of engagement between an outward protrusion portion and a positioning column according to some embodiments of the present disclosure:

FIG. 12 is a schematic view of engagement between an outward protrusion portion and a positioning column according to some embodiments of the present disclosure;

FIG. 13 is a schematic view of engagement between an outward protrusion portion and a positioning column according to some embodiments of the present disclosure;

FIG. 14 is a schematic view of engagement between an outward protrusion portion and a positioning column according to some embodiments of the present disclosure;

FIG. 15 is a schematic partial structural view of a support member according to some embodiments of the present disclosure:

FIG. 16 is a schematic structural view of a support member according to some embodiments of the present disclosure;

FIG. 17 is a flowchart of a method for manufacturing a support member of a flexible display module according to some embodiments of the present disclosure; and FIG. 18 is a schematic structural view of a flexible display module according to some embodiments of the present disclosure.

DETAILED DESCRIPTION

To make the objectives, technical solutions, and advantages of the present disclosure clearer, the following further describes implementations of the present disclosure in detail with reference to the accompanying drawings.

Unless otherwise defined, technical or scientific terms used herein shall have their ordinary meaning as understood by a person of ordinary skill in the art to which this disclosure pertains. The terms "first," "second," "third," and the like, as used in the specification of the patent disclosure and the claims of the present disclosure, do not denote any order, number, or significance, but are used only to distinguish between different components. Similarly, the term "a" or "an" and similar terms do not indicate a limitation of quantity, but rather the existence of at least one. Similar terms such as "includes" or "contains" mean that the element or object that now precedes "includes" or "contains" encompasses the elements or objects listed after "includes"

or "contains" and their equivalents, and does not exclude other elements or objects. The terms such as "connected" or "coupled" are not limited to physical or mechanical connections, but may include electrical connections, whether direct or indirect. The terms "up," "down." "left," "right," and the like are used only to indicate relative positional relationships. In the case that the absolute position of the described object is changed, the described relative positional relations may be changed accordingly.

The foldable electronic device typically includes a foldable center frame and a flexible display module. The foldable center frame is folded and unfolded relatively, and the flexible display module is disposed on a side of the foldable center frame and connected to the foldable center frame. During assembling the electronic device, the flexible display module and the foldable center frame need to be bonded into one piece on an assembly table.

FIG. 1 is a schematic structural view of a flexible display module in some practices. As illustrated in FIG. 1, the flexible display module includes a flexible display panel 11 and a support member 12. The flexible display panel 11 has front and rear surfaces that are opposite to each other, wherein the front surface is a display surface for displaying images. The flexible display panel 11 is disposed on a surface of the support member 12, and a back surface of the flexible display panel 11 is opposite to the support member 12 and is connected to the flexible display panel 11, in some embodiments, by bonding with a pressure sensitive adhesive layer 13. In assembling an electronic device, the flexible display module is usually placed on an assembly table, and then is connected to the foldable center frame, in some embodiments, by bonding with a pressure sensitive adhesive. Since the flexible display module is flexible, it is difficult to control the precision of the adhesive in the case that the flexible display module is placed on the assembly table and connected to the foldable center frame. As a result, a large deviation is easily generated in the case that the adhesive is applied, in some embodiments, a large fitting deviation between the flexible display module and the foldable center frame is generated, thereby causing an adverse effect on the electronic device.

FIG. 2 is a schematic structural view of a support member of a flexible display module according to some embodiments of the present disclosure. As illustrated in FIG. 2, the support member includes a body portion 20 and a plurality of outward protrusion portions 30. The plurality of outward protrusion portions 30 are distributed at least at two opposite sides of the body portion 20 and protrude outwards relative to the sides of the body portion 20. Each of the outward protrusion portions 30 has a positioning hole 30a.

FIG. 3 is a schematic structural view of an assembly table according to some embodiments of the present disclosure. As illustrated in FIG. 3, the assembly table includes a support portion 40 and a plurality of positioning columns 50. The support portion 40 has a support surface 40a, wherein the support surface 40a is configured to bear a support member. The plurality of positioning columns 50 stand on the support surface 40a and are connected to the support surface 40a. The plurality of positioning columns 50 are configured to be engaged with the positioning holes 30a in at least portion of outward protrusion portions 30 of the support member.

In a process of manufacturing the electronic device, the flexible display module is placed on the support surface 40a, at least portion of the outward protrusion portions 30 of the support member are sleeved on the positioning columns 50, and the positioning columns 50 are engaged with the positioning holes 30a in the outward protrusion portions 30 to position the flexible display module. In this way, during assembling the flexible display module and the foldable center frame, it is only necessary to position the foldable center frame and the support surface 40a. As a result, it is possible to ensure that the deviation of the relative position between the flexible display module and the foldable center frame is small.

As illustrated in FIG. 3, each of the positioning columns 50 includes a first section 51 and a second section 52. The first section 51 is a straight column and the second section 52 is a table. One end of the first section 51 is connected to the support surface 40a, and the other end of the first section 51 is connected to a larger end of the second section 52.

In some embodiments, the first section 51 is cylindrical and the second section 52 is frustoconical. In some embodiments, the first section 51 is prismatic and the second section 52 is prismatic.

The second section 52 is a table body, which plays a guiding role in the case that each of the positioning holes 30a is sleeved on each of the positioning columns 50, such that positioning the flexible display module is facilitated.

The shape of the first section 51 depends on that of each of the corresponding positioning holes 30a. In some embodiments, each of the positioning holes 30a is circular or oval and the first section 51 is cylindrical. In some embodiments, each of the positioning holes 30a is rectangular, and the first section 51 is quadrangular.

In some embodiments, the length of the first section 51 is not less than that of each of the positioning holes 30a, such that an entire hole wall of each of the positioning holes 30a is engaged with an outer wall of the first section 51 in the case that each of the positioning holes 30a is sleeved outside each of the positioning columns 50.

For the lengths of the positioning columns 50, the lengths of different positioning columns 50 may be the same or different. In some embodiments, the positioning columns 50 for engaging with the outward protrusion portions 30 on the opposite sides of the main body 20 have the same length, and the positioning columns 50 for engaging with the outward protrusion portions 30 on the adjacent sides of the main body 20 have different lengths.

In some embodiments, the positioning columns 50 are arranged in one-to-one correspondence to the positioning holes 30a. In the case that the flexible display module is positioned, the positioning columns 50 are inserted into the corresponding positioning holes 30a, and each of the positioning columns 50 is inserted into each of the positioning holes 30a. In some embodiments, the number of the positioning columns 50 may also be less than that of the positioning holes 30a. In the case that the flexible display module is positioned, the positioning columns 50 are inserted into the positioning holes 30a, and a portion of the positioning holes 30a are not sleeved outside the positioning columns 50. The function of the portion of the positioning holes 30a that are not sleeved outside the positioning columns 50 is described hereinafter.

In the support member for the flexible display module, the outward protrusion portions 30 is provided at the side of the body portion 20, the outward protrusion portions 30 having the positioning holes 30a. The flexible display module is placed on the assembly table during assembling the flexible display module, and the foldable center frame is positioned by engagement between the positioning holes 30a in the outward protrusion portions 30 and the positioning columns on the assembly table. Since the outward protrusion portions 30 are distributed at least at two opposite sides of the body portion 20 of the support member, the flexible display module is kept in a flat state during positioning, such that the precision of fitting between the flexible display module and the foldable center frame is effectively improved and the fitting deviation is reduced.

In some embodiments, the body portion 20 has a first surface and a second surface that are opposite to each other, wherein the first surface is configured to connect the flexible display panel. Surfaces, close to the second surface, of the protrusion portions 30 is coplanar with the second surface of the body portion 20. In this way, in the case that the flexible display module is placed on the support surface 40a, the second surface of the body portion 20 and the surfaces of the protrusion portions 30 are fitted to the support surface 40a, such that the flexible display module is placed more smoothly.

In some embodiments, surfaces, close to the second surface, of the protrusion portions 30 may not be coplanar with the second surface of the body portion 20, in some embodiments, the protrusion portions 30 are entirely disposed on a side, close to the first surface, of a plane where the second surface of the body portion 20 is disposed.

FIG. 4 is a top view of a support member according to some embodiments of the present disclosure. As illustrated in FIG. 4, in the support member, a body portion 20 has two first sides 20a that are opposite to each other and two second sides 20b that are opposite to each other, and two ends of each of the two second sides 20b are respectively connected to the two first sides 20a.

The first side 20a is intersected with the second side 20b. In some embodiments, the first side 20a and the second side 20b are perpendicular to each other.

The body portion 20 has a bending region 201 extending from one of the first sides 20a to the other of the first sides 20a. Each of the two second sides 20b is connected to at least one of the outward protrusion portions 30.

In some embodiments, in the support member illustrated in FIG. 4, each second side 20b is connected to two outward protrusion portions 30. In some embodiments, each second side 20b may be connected to one outward protrusion portion 30, or a greater number of the outward protrusion portions. The number of outward protrusion portions 30 connected to each second side 20b may be defined based on a length of the second side 20b. Where the second side 20b is connected to a plurality of outward protrusion portions 30, the plurality of outward protrusion portions 30 may be equally spaced along the second side 20b.

The bending region 201 has a hollow structure. The hollow structure may include a plurality of through-holes. In some embodiments, as illustrated in FIG. 4, a plurality of strip-shaped through-holes 201a are distributed in the bending region 201, and length directions of the plurality of strip-shaped through-holes 201a are all parallel to the second side 20b. By arranging the plurality of strip-shaped through-holes 201a in the bending region 201, the stiffness of the support member in the bending region 201 is lowered, such that the support member is able to undergo bending in the bending region 201. In the case that the flexible display module is folded, the two first sides 20a are bent, and the two second sides 20b are relatively close together.

The hollow structure illustrated in FIG. 4 is only exemplary. In other exemplary embodiments, the hollow structure may also include other shapes of through-holes, and the shapes of the different through-holes may be the same or different, and the sizes of the different through-holes may be the same or different.

The arrangement of the bending region 201 makes it easier for the flexible display module to produce deformation along a bending axis of the bending region 201. By arranging the outward protrusion portions 30 at the two second sides 20b of the body portion 20, the outward protrusion portions 30 on the second sides 20b are configured to be engaged with the positioning columns on the assembly table during assembling the electronic device to avoid deformation of the flexible display module along the bending axis of the bending region 201, such that the flexible display module is kept flat.

The support member may be a metal material, in some embodiments, stainless steel. The structures of the body portion 20, the outward protrusion portions 30, the positioning holes 30a, and the strip-shaped through-holes 201a, of the support member may be formed by means of stamping.

As illustrated in FIG. 4, in some embodiments, one of the first sides 20a of the body portion 20 is connected to the outward protrusion portions 30.

By further arranging the outward protrusion portions 30 on the first side 20a of the body portion 20, the precision of positioning the flexible display module is further improved during assembly.

In some embodiments, one of the first sides 20a of the body portion 20 is connected to the plurality of outward protrusion portions 30. In some embodiments, in the support member illustrated in FIG. 4, one of the first sides 20a of the body portion 20 is connected to two outward protrusion portions 30. The two outward protrusion portions 30 are symmetrically arranged about the bending region 201. The two outward protrusion portions 30 on the two second sides 20b of the body portion 20 may also be arranged symmetrically about the bending region 201.

In electronic devices, the flexible display module is usually connected to other devices, in some embodiments, printed circuit boards, batteries, and the like, via a flexible circuit board. The flexible circuit extends out from one of the first sides 20a of the body portion 20 relative to the flexible display module. In the support member illustrated in FIG. 4, only one of the first sides 20a is provided with the outward protrusion portions 30, and the other of the first sides 20a is not provided with the outward protrusion portions 30. In this way, in the case that the flexible display module is manufactured, the flexible circuit board extends out from the first side 20a which is not provided with the outward protrusion portions 30, thereby avoiding affecting the arrangement of the flexible circuit board.

In some embodiments, FIG. 5 is a schematic structural view of a support member according to some embodiments of the present disclosure. As illustrated in FIG. 5, in the support member, both of the first sides 20a of the body portion 20 are provided with outward protrusion portions 30. Even though extending out from one of the first sides 20a of the body portion 20, the flexible circuit board does not occupy all of the space on the first sides 20a. The outward protrusion portions 30 are arranged at positions where the flexible circuit board is avoided on the first sides 20a, such that further positioning is performed from the two first sides 20a without affecting the arrangement of the flexible circuit board.

The outward protrusion portions 30 may be rectangular, square, semi-circular, or other shapes. In some embodiments, as illustrated in FIG. 5, the outward protrusion portions 30 are square, with both sides having a length of 5 mm to 8 mm.

In some embodiments, the positioning holes 30a may be ones of circular holes, elliptical holes, and strip-shaped holes. The strip-shaped holes are holes having sets of parallel pairs of edges and lengths greater than widths, including but not limited to, rectangular holed, waisted circular holes, rounded rectangular holes, and hexagonal holes. In some embodiments, the rectangular holes are illustrated in the embodiments of the present disclosure.

Different shapes of holes have different positioning effects. In some embodiments, in the case that the circular holes are engaged with the positioning columns, ranges of gaps between the walls of the circular holes and the outer walls of the positioning columns are the same everywhere in the radial direction of the circular holes, that is, the positioning precisions are the same in all directions. In the case that the positioning holes 30a are elliptical holes, the length direction of each of the positioning holes 30a is the long axis direction of each of the elliptical holes, and the width direction of the each of the positioning holes 30a is the short axis direction of each of the elliptical holes. The lengths and the widths of the elliptical holes are different, which makes the gaps between the positioning columns and the walls of the elliptical holes different in the length direction and the width direction of the elliptical holes, that is, the positioning precisions are different in the length direction and the width direction of the elliptical holes.

In some embodiments, in the plurality of outward protrusion portions 30, at least two positioning holes in the outward protrusion portions 30 are different shapes.

By arranging at least two different shapes of positioning holes 30a for positioning, it is possible to have both easy positioning and high positioning precision.

In some embodiments, the plurality of outward protrusion portions 30 at least include first outward protrusion portions 301 and second outward protrusion portions 302, wherein positioning holes in the first outward protrusion portions 301 are the circular holes, and positioning holes in the second outward protrusion portions 302 are elliptical holes with short axis lengths greater than the diameters of the circular holes or strip-shaped holes with the widths greater than the diameters of the circular holes. The first outward protrusion portions 301 are connected to the first sides 20a and the second outward protrusion portions 302 are connected to the second sides 20b.

FIG. 6 is a schematic enlarged view at a region A in FIG. 4. As illustrated in FIG. 6, the positioning holes 30a in first outward protrusion portions 301 are circular holes in the support member. FIG. 7 is a schematic enlarged view at a region B in FIG. 4, and FIG. 8 is a schematic enlarged view at a region C in FIG. 4. As illustrated in FIGS. 7 and 8, the positioning holes 30a in the second outward protrusion portions 302 are elliptical holes.

In positioning the flexible display module, the circular holes achieve fine positioning and are more difficult to align with the positioning columns 50, and the elliptical holes achieve coarse positioning and are easier to align with the positioning columns 50. FIG. 9 is a schematic view of engagement between outward protrusion portions and positioning columns according to some embodiments of the present disclosure. As illustrated in FIG. 9, the positioning holes 30a in second outward protrusion portions 302 are engaged with the corresponding positioning columns 50. The precision of positioning the flexible display module is higher in the width direction of the elliptical holes, such that the flexible display module is only moved in a smaller magnitude or is not moved. The precision of positioning the flexible display module is relatively lower in the length direction of the elliptical holes, such that the flexible display module is moved in a slightly larger magnitude. The elliptical holes coarsely position the flexible display module, making it easier to align the circular holes with the positioning columns 50 and sleeve the circular holes outside the corresponding positioning columns 50. In the case that the circular holes are sleeved to the corresponding positioning columns 50, the flexible display module is limited, such that the flexible display module is not moved or is only moved by a small amplitude in the length direction of the elliptical holes.

In the support member illustrated in FIG. 9, a machining precision of each the circular holes is greater than a machining precision of each of the elliptical holes and the rectangular holes. In the case that one of first outward protrusion portions 301 is arranged on the first side 20a, each of the circular holes in the first outward protrusion portions 301 is sleeved outside each of the positioning columns 50, and the flexible display module is moved by a very small amplitude of movement in the length direction of each of the elliptical holes. By arranging two of the first outward protrusion portions 301 on the first side 20a, the circular holes in the two first outward protrusion portions 301 are sleeved onto the two positioning columns 50 respectively because the spacing of the positioning columns 50 engaged with the two first outward protrusion portions 301 on the first side 20a is definite. In this way, the movement amplitude of the flexible display module is further limited, and thus it is conducive to improving the precision of positioning the flexible display module. Moreover, some dimensional and geometrical tolerances are allowed in manufacturing of the support member, and the circular holes in the two first outward protrusion portions 301 position the first side 20a with high precision, such that the tolerances of the support member are averaged to the two sides of the flexible display module, that is, the second sides 20b, and the display screen is better centered in the case that the electronic device is assembled.

In some embodiments, the length direction of the positioning holes 30a in the second outward protrusion portions 302 is perpendicular or parallel to the second sides 20b. In FIG. 9, the positioning holes 30a in the second outward protrusion portions 302 are the elliptical holes, and the length direction of the positioning hole 30a is in the direction of the long axis of each of the elliptical holes and the long axis of each of the elliptical holes are both perpendicular to the second sides 20b.

In the embodiment illustrated in FIG. 9, the length direction of the positioning holes 30a in the second outward protrusion portions 302 is perpendicular to the second sides 20b. In the case that the positioning holes 30a in the second outward protrusion portions 302 are sleeved onto the positioning columns 50, in the width direction of the positioning holes 30a. i.e., the direction parallel to the second sides 20b, the precision of positioning the flexible display module is higher, such that the flexible display module is only moved with a small amplitude or is not moved. In the direction perpendicular to the second sides 20b, the precision of positioning the flexible display module is slightly lower, such that the flexible display module is moved with a specific amplitude. In the case that the positioning holes 30a in the first outward protrusion portions 301 are completely sleeved onto the positioning columns 50, in the direction perpendicular to the second sides 20b, the precision of positioning the flexible display module is also higher, such that the flexible display module is only moved by a small amplitude or is not moved.

In some embodiments, as illustrated in FIG. 10, the length directions of the positioning holes 30a in the second outward protrusion portions 302 is parallel to the second sides 20b.

In the case that the positioning holes 30a in the second outward protrusion portions 302 are sleeved onto the positioning columns 50, in the width direction of the positioning hole 30a, i.e., the direction perpendicular to the second sides 20b, the precision of positioning the flexible display module is higher, such that the flexible display module is only moved with a small amplitude or is not moved. In the direction parallel to the second sides 20b, the precision of positioning the flexible display module is slightly lower, such that the flexible display module is e moved with a specific amplitude. In the case that the positioning holes 30a in the first outward protrusion portions 301 are completely sleeved onto the positioning columns 50, in the direction parallel to the second sides 20b, the precision of positioning the flexible display module is higher, such that the flexible display module is only moved by a small amplitude or is not moved.

FIG. 11 is a schematic view of engagement between an outward protrusion portion and a positioning column according to some embodiments of the present disclosure. As illustrated in FIG. 11, in the support member, each of the second sides 20b of the body portion 20 is connected to two second outward protrusion portions 302, and on at least one of the second sides 20b, the length directions of the positioning holes 30a in the two second outward protrusion portions 302 connected to the same second side 20b are perpendicular to each other.

To sleeve the elliptical positioning holes 30a onto the corresponding positioning columns 50, the elliptical positioning holes 30a need to be aligned with the positioning columns, that is, orthographic projections of end surfaces of the positioning columns far away from the support surface of the assembling table on the support surface is disposed in orthographic projections of the positioning holes 30a in the support surface of the assembling table. During alignment, the position of the flexible display module relative to the positioning columns needs to be adjusted in the length direction and the width direction of the positioning holes 30a Since the lengths of the positioning holes 30a are greater than the widths, the adjustment in the length direction of the positioning holes 30a is easier.

For the flexible display module with a large area, there may be a certain deformation during transit, thereby increasing the difficulty of alignment. In the embodiments of the present disclosure, by defining the length directions of the positioning holes 30a in the two second outward protrusion portions 302 connected to one of the second sides 20b to be perpendicular to each other, such that no matter whether the flexible display module is moved in a direction perpendicular to the second sides 20b or in a direction parallel to the second sides 20b during alignment, it is possible to make one of the elliptical positioning holes 30a align more quickly with one of the positioning columns. As long as one of the elliptical positioning holes 30a is aligned with one of the positioning columns and sleeved onto one of the positioning column, the other elliptical positioning holes 30a are also able to be quickly aligned with the corresponding positioning columns. In the case that both elliptical positioning holes 30a, which are perpendicular to each other in the length direction, are aligned with the positioning columns, the precision of positioning the flexible display module is higher in both directions perpendicular to each other, thereby making it easier for the circular positioning holes 30a to be aligned with the positioning columns.

In some embodiments, the diameters of the circular holes are less than the lengths of the short axis of the elliptical holes. By setting the diameters of the circular holes to be less than the lengths of the short axis of the elliptical holes, in the case that the circular holes and the elliptical holes are machined, the circular holes have higher machining precision, and during positioning, the circular holes achieve a higher positioning precision.

In some embodiments, the lengths of the short axis of the elliptical holes are 1.1 times to 1.5 times the diameters of the circular holes.

In some embodiments, the ratio of the length to the width of each of the positioning holes 30a in the second outward protrusion portions 302 is in the range of (1, 1.3]. For the elliptical holes, that is, the ratio of the length of the long axis to the length of the short axis is in the range of (1, 1.3]. The length of the long axis of each of the elliptical holes is slightly greater than the length of the short axis thereof. In the case that the difference in length is too large, the positioning precision of the elliptical holes in the direction of the long axis is too low, which is not conducive to the alignment of the circular holes with the positioning columns.

FIG. 12 is a schematic view of engagement between an outward protrusion portion and a positioning column according to some embodiments of the present disclosure. As illustrated in FIG. 12, the support member differs from the support member illustrated in FIG. 9 in that in FIG. 12, positioning holes 30a in second outward protrusion portions 302 are the rectangular holes. A length of each of the rectangular holes is greater than a width thereof, and the rectangular holes have the same effect as the elliptical holes during positioning.

In positioning the flexible display module, the circular holes are finely positioned, and are thus difficult to be aligned with the positioning columns 50. The rectangular holes are coarsely positioned, which is easy to align with the positioning columns 50, just like the elliptical holes. The positioning holes 30a in the second protrusion portions 302 are sleeved onto the corresponding positioning columns 50, and the precision of positioning the flexible display module is higher in the width direction of the rectangular holes, such that the flexible display module is only moved by a small amplitude or is not moved. The precision of positioning the flexible display module is relatively lower in the length direction of the rectangular hole, such that the flexible display module is moved by a slightly larger amplitude. The rectangular holes coarsely position the flexible display module, such that the circular holes are easily aligned with the positioning columns 50 and sleeved outside the corresponding positioning columns 50. In the case that the circular holes are sleeved to the corresponding positioning columns 50, the flexible display module is limited, such that the flexible display module is not moved or is only moved by a small amplitude in the length direction of the rectangular holes.

The length directions of the positioning holes 30a in the second outward protrusion portions 302 are perpendicular or parallel to the second sides 20b. In FIG. 12, the positioning holes 30a in the second outward protrusion portions 302 are rectangular holes, and the length directions of the positioning holes 30a are the length directions of the rectangular holes, that is, directions of long sides of the rectangular holes. The long sides of the rectangular holes are perpendicular to the second sides 20b.

In some embodiments, in FIG. 13, the length directions of the positioning holes 30a in the second outward protrusion portions 302 are parallel to the second sides 20b.

FIG. 14 is a schematic view of engagement between an outward protrusion portion and a positioning column according to some embodiments of the present disclosure.

The support member illustrated in FIG. 14 differs from the support member illustrated in FIG. 11 in that the positioning holes 30*a* in the second protrusion portions 302 are rectangular holes. The support member illustrated in FIG. 14 and the support member illustrated in FIG. 11 achieve basically the same effect in positioning.

In some embodiments, the ratio of the length to the width of each of the rectangular holes is in the range of (1, 1.3]. For the rectangular holes, that is, the ratio of the length of the long side to the length of the short side is in the range of (1, 1.3]. The length of the long side of each of the rectangular holes is slightly greater than the length of the short side thereof. In the case that the difference in length is too large, the positioning precision of the rectangular holes in the direction of the long sides is too low, which is not conducive to the alignment of the circular holes with the positioning columns 50.

In some embodiments, the width of each of the strip-shaped holes is 1.1 times to 1.5 times the radius of each of the circular holes. For the rectangular holes, that is, the length of each of the short sides of each of the rectangular holes is 1.1 times to 1.5 times the radius of each of the circular holes. By setting the diameters of the circular holes to be less than the widths of the strip-shaped holes, in the case that the circular holes and the strip-shaped holes are machined, the circular holes have higher machining precision, and during positioning, the circular holes have higher positioning precision.

In some embodiments, at least one of the second sides 20*b* is connected to the plurality of the outward protrusion portions 30, and the positioning hole 30*a* in at least one of the plurality of outward protrusion portions 30 is a rectangular hole, and a long side of the rectangular hole is perpendicular or parallel to the second side 20*b*. In the case that the positioning is performed, the positioning hole 30*a* in the outward protrusion portion 30 is not sleeved outside one of the positioning column 50. The rectangular positioning hole 30*a* of the outward protrusion portion 30 is configured to perform monitoring. In the case that the flexible display module is delivered to the assembly table, based on an angle between the long side or the short side of the positioning hole 30*a* and a marking line used as a reference, it is determined whether or not an orientation in which the flexible display module is placed is accurate. The marking line for reference is a marking line for indicating an upper, lower, left, right or other direction of a display region of the flexible display module in the case that the flexible display module is placed flat on the support surface. The marking line may be disposed on the support surface. The rectangular positioning hole 30*a* and the marking line more accurately determine the direction of the flexible display module, such that when the flexible display module displays an image, a direction in which the image is upright is parallel or perpendicular to the bezel of the electronic device.

FIG. 15 is a schematic partial structural view of a support member according to some embodiments of the present disclosure. As illustrated in FIG. 15, the support member has a first strip-shaped groove 303. The first strip-shaped groove 303 is arranged in a junction between an outward protrusion portion 30 and a body portion 20, and the first strip-shaped groove 303 extends along an edge of the body portion 20.

The first strip-shaped groove 303 may be arranged on one side of the support member or on each of both sides of the support member. In some embodiments, in FIG. 15, the first strip-shaped groove 303 is arranged in each of the both sides of the support member.

By arranging the first strip-shaped groove 303 in the junction between the outward protrusion portion 30 and the body portion 20, a thickness of the support member at the first strip-shaped groove 303 is made smaller, such that the structural strength of the junction between the outward protrusion portion 30 and the body portion 20 is reduced. In the case that the bonding of the flexible display module to the foldable center frame is completed, the outward protrusion portion 30 is easily to be removed. In this way, the foldable center frame does not need to be blocked from the outward protrusion portion 30, thereby effectively reducing a width of the bezel of the electronic device.

In some embodiments, the outward protrusion portions 30 are removed by repeated bending or by cutting. e.g., laser cutting.

In some embodiments, the support member may also have a plurality of through-holes 304 disposed in the junction between the outward protrusion portions 30 and the body portion 20 and are spaced along the edge of the body portion 20.

By arranging the plurality of through-holes 304 in the junction between the outward protrusion portions 30 and the body portion 20, it is also possible to reduce the structural strength of the junction between the outward protrusion portions 30 and the body portion 20. In the case that the bonding of the flexible display module to the foldable center frame is completed, the outward protrusion portions 30 are easily removed.

In the embodiment illustrated in FIG. 15, both the first strip-shaped grooves 303 and the plurality of through-holes 304 are provided, and the through-holes 304 are disposed in the first strip-shaped grooves 303, which further reduces the structural strength at the junction between the outward protrusion portions 30 and the body portion 20, and facilitates the removal of the outward protrusion portions 30.

As illustrated in FIG. 15, at a bottom of each of the first strip-shaped grooves 303, a second strip-shaped groove 305 may be further provided and extends along the edge of the body portion 20. By further providing the second strip-shaped grooves 305 at the bottoms of the first strip-shaped grooves 303, not only the structural strength of the junction between the outward protrusion portions 30 and the body portion 20 is further reduced, but also during removing the outward protrusion portions by bending, it is ensured that the support member is broken from the second strip-shaped grooves 305, and the break is smoother.

In some embodiments, a width of the second strip-shaped groove 305 may be one-fifth to one-tenth of a width of the first strip-shaped groove 303.

FIG. 16 is a schematic structural view of a support member according to some embodiments of the present disclosure. As illustrated in FIG. 16, the support member includes a body portion 20 and a plurality of outward protrusion portions. A hollow structure of a bending region 201 of the body portion 20 includes a plurality of through-holes with a gradual distribution density. The distribution density is the number of through-holes per unit area.

The plurality of outward protrusion portions 30 at least include first outward protrusion portions 301 and second outward protrusion portions 302. Positioning holes 30*a* in the first outward protrusion portions 301 are circular holes, and the positioning holes 30*a* in the second outward protrusion portions 302 are elliptical holes. In some embodiments, the positioning holes 30*a* in the second outward protrusion portions 302 may also be strip-shaped holes.

As illustrated in FIG. 16, one of first sides 20*a* is connected to at least one of the first outward protrusion portions 301, and the other first side 20a is connected to at least one of the second outward protrusion portions 302. The two second sides 20b are both connected to at least one of the first outward protrusion portions 301 and at least one of second outward protrusion portions 302. The first outward protrusion portions 301 connected to the second sides 20b are proximate to the first sides 20a connected to the second outward protrusion portions 302. The second outward protrusion portions 302 connected to the second sides 20b are proximate to the first sides 20a connected to the first outward protrusion portions 301.

During assembling, the flexible display module is first coarsely positioned by the positioning holes 30a in the three second protrusion portions 302, and then finely positioned by the positioning holes 30a in the three first protrusion portions 301 to improve positioning precision.

As illustrated in FIG. 16, the length directions of the positioning holes 30a in the second outward protrusion portions 302 connected to the first side 20a are perpendicular to the first sides 20a. The length directions of the positioning holes 30a in the second outward protrusion portions 302 connected to the second sides 20b are perpendicular to the second sides 20b. In this way, the length direction of each of the positioning holes 30a in the second outward protrusion portions 302 on the first sides 20a is perpendicular to the length direction of each of the positioning holes 30a in the second outward protrusion portions 302 on the second sides 20b, and the flexible display module is positioned in two mutually perpendicular directions respectively.

In some embodiments, the diameter of each of the positioning holes 30a in the first outward protrusion portions 301 connected to the first sides 20a is smaller than the diameter of each of the positioning holes 30a in the first outward protrusion portions 301 connected to the second sides 20b. The smaller diameters of the positioning holes 30a achieve higher positioning precision. By arranging the positioning holes 30a with higher positioning precision on the first sides 20a, the display region is more centered during positioning of the flexible display panel, thereby avoiding excessive deviation of the display region from a predetermined position in a direction parallel to the first sides 20a due to errors, tolerances, or the like.

In some embodiments, the positioning holes 30a in the first outward protrusion portions 301 connected to the second sides 20b each have a diameter of 1.8 mm to 3.8 mm. The positioning holes 30a in the second outward protrusion portions 302 connected to the second sides 20b each have a length of 1.8 mm to 3.8 mm and a width of 1.3 mm to 3.3 mm. The positioning holes 30a in the first outward protrusion portions 301 connected to the first sides 20a each have a diameter of 1.3 mm to 3.3 mm, and the positioning holes 30a in the second outward protrusion portions 302 connected to the first sides 20a each have a length of 1.8 mm to 3.8 mm and a width of 1.3 mm to 3.3 mm.

In some embodiments, the length of the long axis of each of the elliptical holes may not be less than the diameter of each of the circular holes, the length of the short axis of each of the elliptical holes may not be greater than the diameter of each of the circular holes, and the length of the long axis of each of the elliptical holes is greater than the length of the short axis of each of the elliptical holes. The length of each of the strip-shaped holes is not less than the diameter of each of the circular holes, the width of each of the strip-shaped holes is not greater than the diameter of each of the circular holes, and the length of each of the strip-shaped hole is greater than the width of each of the strip-shaped holes.

Taking the elliptical holes as a reference, the diameter of each of the circular holes falls between the length of the long axis and the length of the short axis of each of the elliptical holes. The length of the long axis of each of the elliptical holes is greater than the diameter of each of the circular holes, resulting in lower positioning precision in the long axis direction, such that the elliptical holes are easier to be sleeved outside the corresponding positioning columns. The elliptical holes achieve higher positioning precision in the short axis direction, and the circular holes achieve the same positioning precision in all directions, such that the flexible display module also achieve higher positioning precision in the long axis direction of the elliptical holes.

FIG. 17 is a flowchart of a method for manufacturing a support member for a flexible display module according to some embodiments of the present disclosure. The method is used to manufacture the support member of any one of the flexible display modules illustrated in FIGS. 2 and 4 to 16. As illustrated in FIG. 17, the manufacturing method includes the following steps.

In S11, a plate is provided.

In some embodiments, the plate may be metal, such as a stainless-steel plate.

In S12, the plate is stamped to form a connected body portion 20 and a plurality of outward protrusion portions 30.

The plurality of outward protrusion portions 30 are distributed at least on two opposite sides of the body portion 20, and the outward protrusion portions 30 protrude outwards relative to the sides of the main body 20. Positioning holes 30a are arranged in the outward protrusion portions 30.

The support member is prepared by directly stamping the plate, and the positioning holes 30a are formed by means of stamping for efficient manufacture. For the support member having strip-shaped holes 201a, the strip-shaped holes 201a are also formed by means of stamping.

FIG. 18 is a schematic structural view of a flexible display module according to some embodiments of the present disclosure. As illustrated in FIG. 18, the flexible display module includes a flexible display panel 1601 and the support member 1602 as illustrated in any one of FIGS. 2 and 4 to 16. The flexible display panel 1601 is disposed on one side of the support member 1602 and is connected to a body portion 20 of the support member 1602. The outward protrusion portions 30 of the support member 1602 protrude outwards relative to an edge of the flexible display panel 1601.

The embodiments of the present disclosure also provide an electronic device that may be, but is not limited to, a cell phone, a tablet, or a laptop computer.

The electronic device includes the foldable center frame and the flexible display module as illustrated in FIG. 18. The flexible display module is connected to the foldable center frame.

Described above are merely exemplary embodiments of the present disclosure, which are not intended to limit the present disclosure. Within the spirit and principles of the present disclosure, any modifications, equivalent substitutions, improvements, and the like fall within the protection scope of the present disclosure.

The invention claimed is:

1. A support member of a flexible display module, comprising: a body portion and a plurality of outward protrusion portions, wherein the plurality of outward protrusion portions are at least distributed at two opposite sides of the body portion and protrude outwards relative to the sides of the body portion, and a positioning hole is formed in each of the outward protrusion portions;

wherein the body portion has two first sides that are opposite to each other and two second sides that are opposite to each other, two ends of each of the two second sides being respectively connected to the two first sides; the body portion has a bending region, the bending region extending from one of the two first sides to the other of the two first sides; and the two second sides are each connected to at least one of the outward protrusion portions.

2. The support member according to claim 1, wherein the positioning holes are circular holes, elliptical holes, or strip-shaped holes.

3. The support member according to claim 2, wherein the positioning holes in at least two of the plurality of outward protrusion portions have different shapes.

4. The support member according to claim 1, wherein at least one of the two first sides is connected to one of the outward protrusion portions.

5. The support member according to claim 4, wherein the plurality of outward protrusion portions at least comprise first outward protrusion portions and second outward protrusion portions, wherein the positioning holes in the first outward protrusion portions are circular holes, the positioning holes in the second outward protrusion portions are elliptical holes each with a short axis length being greater than a diameter of each of the circular holes or striped-shaped holes each with a width being greater than the diameter of each of the circular holes, the first outward protrusion portions are connected to the first sides, and the second outward protrusion portions are connected to the second sides.

6. The support member according to claim 5, wherein length directions of the positioning holes in the second outward protrusion portions are perpendicular or parallel to the second sides, wherein in the case that the positioning holes in the second outward protrusion portions are elliptical holes, the length direction of each of the positioning holes is a long axis direction of each of the elliptical holes, and wherein in the case that the positioning holes in the second outward protrusion portions are strip-shaped holes, the length direction of each of the positioning holes is a length direction of each of the strip-shaped holes.

7. The support member according to claim 6, wherein each of the second sides is connected to two of the second outward protrusion portions, and wherein on at least one of the second sides, the length directions of the positioning holes in the two of the second outward protrusion portions connected to the same second side are perpendicular to each other.

8. The support member according to claim 6, wherein a ratio of a length to a width of each of the positioning holes in the second outward protrusion portions is in the range of (1, 1.3].

9. The support member according to claim 6, wherein a length of a short axis of each of the elliptical holes is 1.1 times to 1.5 times a diameter of each of the circular holes; and a width of each of the strip-shaped holes is 1.1 times to 1.5 times a radius of each of the circular holes.

10. The support member according to claim 6, wherein a length of a long axis of each of the elliptical holes is not less than the diameter of each of the circular hole, and a length of a short axis of each of the elliptical holes is not greater than the diameter of each of the circular holes; wherein the length of each of the strip-shaped holes is not less than the diameter of each of the circular holes, and a width of each of the strip-shaped holes is not greater than the diameter of each of the circular holes.

11. The support member according to claim 1, wherein the plurality of outward protrusion portions at least comprise first protrusion portions and second protrusion portions, the positioning holes in the first protrusion portions are circular holes, and the positioning holes in the second protrusion portions are elliptical holes or strip-shaped holes;

one of the two first sides is connected to at least one of the first outward protrusion portions and the other of the two first sides is connected to at least one of the second outward protrusion portions; and each of the two second sides is connected to at least one of the first outward protrusion portions and at least one of the second outward protrusion portions, and the first outward protrusion portions connected to the second sides are close to the first sides connected to the second outward protrusion portions, and the second outward protrusion portions connected to the second sides are close to the first sides connected to the first outward protrusion portions.

12. The support member according to claim 11, wherein length directions of the positioning holes in the second outward protrusion portions connected to the first sides are perpendicular to the first sides; or length directions of the positioning holes in the second outward protrusion portions connected to the second sides are perpendicular to the second sides.

13. The support member according to claim 11, wherein a diameter of each of the positioning holes in the first outward protrusion portions connected to the first sides is less than a diameter of each of the positioning holes in the first outward protrusion portions connected to the second sides.

14. The support member according to claim 1, wherein a plurality of through-holes are arranged in the support member, wherein the plurality of through-holes are arranged in a junction of the outward protrusion portions and the body portion and are spaced along an edge of the body portion.

15. A flexible display module, comprising a flexible display panel and the support member according to claim 1, wherein the flexible display panel is disposed on one side of the support member and connected to a body portion of the support member, the protrusion portion of the support member is protrude outwards relative to an edge of the flexible display panel.

16. An electronic device, comprising: a foldable center frame and the flexible display module according to claim 15, the flexible display module being connected to the foldable center frame.

17. An assembly table, comprising: a support portion and a plurality of positioning columns, wherein the support portion has a support surface for carrying the flexible display module as defined in claim 15, wherein the plurality of positioning columns stand on the support surface and are connected to the support surface, and the plurality of positioning columns are configured to be engaged with positioning holes in at least portion of the outward protrusion portions of the support member.

18. A support member of a flexible display module, comprising: a body portion and a plurality of outward protrusion portions, wherein the plurality of outward protrusion portions are at least distributed at two opposite sides of the body portion and protrude outwards relative to the sides of the body portion, and a positioning hole is formed in each of the outward protrusion portions;

wherein a first strip-shaped groove is arranged in the support member, wherein the first strip-shaped groove is arranged in a junction of the outward protrusion portions and the body portion and extends along an edge of the body portion.

19. A flexible display module, comprising a flexible display panel and the support member according to claim 18, wherein the flexible display panel is disposed on one side of the support member and connected to a body portion of the support member, the protrusion portion of the support member is protrude outwards relative to an edge of the flexible display panel.

20. A method for manufacturing a support member for a flexible display module, comprising:

providing a plate; and stamping the plate to form a body portion and a plurality of outward protrusion portions that are connected, wherein the outward protrusion portions are at least distributed at two opposite sides of the body portion and protrude outwards relative to the sides of the body portion, and the outward protrusion portions are provided with positioning holes;

wherein the body portion has two first sides that are opposite to each other and two second sides that are opposite to each other, two ends of each of the two second sides being respectively connected to the two first sides; the body portion has a bending region, the bending region extending from one of the two first sides to the other of the two first sides; and the two second sides are each connected to at least one of the outward protrusion portions; or wherein a first strip-shaped groove is arranged in the support member, wherein the first strip-shaped groove is arranged in a junction of the outward protrusion portions and the body portion and extends along an edge of the body portion.

* * * * *